US012686942B2

(12) United States Patent
Shimizu et al.

(10) Patent No.: US 12,686,942 B2
(45) Date of Patent: Jul. 21, 2026

(54) MANUFACTURING METHOD OF SINGLE CRYSTALS

(71) Applicant: SUMCO Corporation, Tokyo (JP)

(72) Inventors: Yasunobu Shimizu, Tokyo (JP); Susumu Tamaoki, Tokyo (JP); Ippei Shimozaki, Tokyo (JP); Keiichi Takanashi, Tokyo (JP); Ken Hamada, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 590 days.

(21) Appl. No.: 18/029,745

(22) PCT Filed: Sep. 22, 2021

(86) PCT No.: PCT/JP2021/034734
§ 371 (c)(1),
(2) Date: Mar. 31, 2023

(87) PCT Pub. No.: WO2022/075061
PCT Pub. Date: Apr. 14, 2022

(65) Prior Publication Data
US 2023/0357950 A1      Nov. 9, 2023

(30) Foreign Application Priority Data
Oct. 7, 2020      (JP) ................................ 2020-169974

(51) Int. Cl.
*C30B 15/26*      (2006.01)
(52) U.S. Cl.
CPC ..................................... *C30B 15/26* (2013.01)
(58) Field of Classification Search
CPC .......... C30B 15/20; C30B 15/26; C30B 29/06
See application file for complete search history.

(56) References Cited

U.S. PATENT DOCUMENTS

2004/0221794 A1    11/2004   Takanashi et al.
2012/0145068 A1*    6/2012   Takanashi .............. C30B 29/06
                                                                  117/15

FOREIGN PATENT DOCUMENTS

JP          2000-128691          5/2000
JP          2004-331437          11/2004
                    (Continued)

OTHER PUBLICATIONS

English computer translation of JP-2019214486-A (Year: 2025).*
                    (Continued)

*Primary Examiner* — Matthew J Song
(74) *Attorney, Agent, or Firm* — Greenblum & Bernstein, P.L.C.

(57)          ABSTRACT

Provided is a process of measuring a space between a melt surface and a seed crystal provided above a melt, a process of lowering the seed crystal based on the space and bringing the seed crystal into contact with the melt, and a process of growing a single crystal by pulling the seed crystal while maintaining contact with the melt. Images of the seed crystal and the melt surface are captured by a camera installed diagonally above the melt surface, a real-image edge approximation circle is generated by approximating a circle from an edge pattern at a lower end of a straight-trunk portion of a real image of the seed crystal, and a mirror-image edge approximation circle is generated by approximating the circle from an edge pattern at the straight-trunk portion of a mirror image of the seed crystal reflected on the melt surface.

9 Claims, 10 Drawing Sheets

(56)  References Cited

FOREIGN PATENT DOCUMENTS

| JP | 2005-170773 | 6/2005 | | |
|----|-------------|--------|---|---|
| JP | 2009-234889 | 10/2009 | | |
| JP | 2016-155729 | 9/2016 | | |
| JP | 2016155729 A | * 9/2016 | ............ | C30B 29/06 |
| JP | 2018-090451 | 6/2018 | | |
| JP | 2018-100195 | 6/2018 | | |
| JP | 2019-214486 | 12/2019 | | |
| JP | 2019214486 A | * 12/2019 | ............ | C30B 15/26 |

OTHER PUBLICATIONS

International Search Report issued in International Patent Application No. PCT/JP2021/034734, dated Nov. 2, 2021, along with an English translation thereof.
Office Action issued in Corresponding CN Patent Application No. 202180068532.7, dated Mar. 3, 2026, along with an English translation thereof.

* cited by examiner

MANUFACTURING METHOD OF SINGLE CRYSTALS

FIELD OF THE INVENTION

The present invention relates to a manufacturing method of single crystals by the Czochralski (CZ) method, and particularly relates to a measuring method of a space between a seed crystal and a melt surface, and a preheating method of the seed crystal using the same.

A large number of silicon single crystals that become substrate materials for semiconductor devices are manufactured by the CZ method. In the CZ method, a polycrystalline silicon raw material is heated in a quartzcrucible to generate a melt, and after a seed crystal is brought into contact with the melt, the seed crystal is slowly pulled while rotating the seed crystal and the melt, thereby growing a large-diameter single crystal at a lower end of the seed crystal. With the CZ method, a manufacturing yield of large-diameter single crystals can be increased.

For the manufacturing method of the single crystals by the CZ method, for example, Patent Literature 1 describes that an image of a seed crystal is captured by an optical camera prior to growing a single crystal, the image captured with the camera is processed to detect a position of the seed crystal, a distal end of the seed crystal is stopped at a standard position provided above a raw material melt, a distance from the standard position to the raw material melt surface is detected, and a crucible that stores the raw material melt is displaced vertically according to the detected distance.

Also, Patent Literature 2 describes a method in which, in order to inhibit dislocation of a seed crystal by a thermal shock when contacting with a melt, the seed crystal is preheated above the melt surface to make the temperature difference between the two as small as possible, then the seed crystal is brought into contact with the melt. Further it is described that, in order to accurately measure a space between the raw material melt surface and the seed crystal, positional information of a real-image lower end point which is a specific point at a lower end of the seed crystal and positional information of a mirror image point which is a point corresponding to the real-image lower end point in a mirror image of the seed crystal reflected on the melt are obtained, the space between the raw material melt surface and the lower end of the seed crystal at the point where the position of the real-image lower end point matches with the position of the mirror image point is defined as zero, and the space between the melt surface of the raw material melt and the lower end of the seed crystal is obtained. In addition, Patent Literatures 1, 3, and 4 describe, in order to inhibit dislocation by thermal shock when contacting with the melt, use of a seed crystal having a tapered shape with the seed crystal having a sharp distal end.

Patent Literature 5 describes that, in order to reduce variation in a preheating position of a seed crystal to improve the non-dislocation melt contacting rate of the seed crystal, an image including a real image of the seed crystal and a mirror image of the seed crystal reflected on a melt surface is captured by a camera diagonally from above, a position of a real-image lower end point, which is a point at a lower end of a straight-trunk portion of the real image of the seed crystal on the image, and a position of a mirror image point, which is a point at an upper end of the straight-trunk portion of the mirror image of the seed crystal corresponding to the real-image lower end point, are respectively obtained, the space between the melt surface and the lower end of the straight-trunk portion of the seed crystal at the point where the position of the real-image lower end point on the image matches with the position of the mirror image point is defined as zero, the space between the melt surface and the lower end of the straight-trunk portion of the seed crystal is obtained, and by subtracting the length of a tapered portion of the seed crystal from the space between the melt surface and the lower end of the straight-trunk portion of the seed crystal, the space between the melt surface and the lower end of the seed crystal is obtained.

RELATED ART

Patent Literature

Patent Literature 1: Japanese Patent Laid-open Publication No. 2005-170773

Patent Literature 2: Japanese Patent Laid-open Publication No. 2016-155729

Patent Literature 3: Japanese Patent Laid-open Publication No. 2000-128691

Patent Literature 4: Japanese Patent Laid-open Publication No. 2009-234889

Patent Literature 5: Japanese Patent Laid-open Publication No. 2019-214486

SUMMARY OF THE INVENTION

Problems to be Solved by the Invention

When controlling a preheating position of a seed crystal based on the position of the seed crystal in the height direction that is found from an image captured by a camera, the seed crystal is preferably brought as close as possible to a melt surface without the seed crystal contacting with the melt. However, the seed crystal and the melt surface are captured diagonally from above by the camera, and therefore, when a seed crystal having a tapered shape is used, the distal end of the tapered shape is hidden behind the seed crystal, and the distal end of the tapered shape cannot be captured by the camera. Further, because the distal end of the tapered portion cannot be captured from a mirror image of the seed crystal reflected on the melt surface, detecting a lower end position of the seed crystal from the mirror image of the seed crystal is also difficult. Furthermore, there are processing variations in the tapered shape of the seed crystal, and therefore, the position of the seed crystal must be controlled considering such processing variations.

Patent Literature 5 describes a method of obtaining the distance from the melt surface to the distal end of the seed crystal having the tapered shape. However, calculation accuracy of the distance from the melt surface to the distal end of the seed crystal is not sufficient and there is a need for creativity to further improve the non-dislocation melt contacting rate of the seed crystal by calculating the distance more accurately.

Accordingly, the present invention provides a manufacturing method of a single crystal that accurately measures a space between a melt surface and a lower end of a seed crystal even when using a seed crystal having a tapered shape at the lower end, and thereby reduce variation in a preheating position when preheating above a melt surface and allows improvement in the non-dislocation melt contacting rate of the seed crystal.

Means for Solving the Problems

In order to resolve the above concerns, a manufacturing method of a single crystal according to the present invention is a manufacturing method of a single crystal by the Czochralski method, and includes a step of measuring a space between a lower end of a seed crystal provided above a melt and a melt surface: a step of lowering the seed crystal based on the space and bringing the seed crystal into contact with the melt; and a step of growing the single crystal at the lower end of the seed crystal by pulling the seed crystal while maintaining a state of contact with the melt. In the step of measuring the space between the melt surface and the lower end of the seed crystal, an image of the seed crystal and the melt surface is captured using a camera installed diagonally above the melt surface, a real-image edge approximation circle is generated by approximating a circle from an approximately arc-shaped edge pattern at the lower end portion of the real image of the seed crystal shown in the image captured by the camera and also a mirror-image edge approximation circle is generated by approximating a circle from an approximately arc-shaped edge pattern at an upper end portion of the mirror image of the seed crystal reflected on the melt surface, and the space between the lower end of the seed crystal and the melt surface is calculated based on the distance from the center coordinates of the real-image edge approximation circle to the center coordinates of the mirror-image edge approximation circle.

According to the present invention, even when the lower end portion of the seed crystal has s tapered shape, the space between the melt surface and the lower end of the seed crystal can be accurately obtained. Therefore, when preheating the seed crystal above the melt, variation in a preheating position is reduced and the non-dislocation melt contacting rate of the seed crystal can be improved.

The manufacturing method of the single crystal according to the present invention preferably converts to distance units in real space by multiplying a conversion factor by a half value of a pixel count from the center coordinates of the real-image edge approximation circle to the center coordinates of the mirror-image edge approximation circle. Accordingly, the space between the melt surface and the lower end of the seed crystal in real space can be accurately obtained.

The manufacturing method of the single crystal according to the present invention preferably further includes a step of obtaining the conversion factor, before measuring the space between the melt surface and the lower end of the seed crystal, from an amount of change in a pixel position of the seed crystal in the captured image when the position of the seed crystal is moved by a fixed distance in the vertical direction. Accordingly, the space between the melt surface and the lower end of the seed crystal in real space can be accurately obtained.

The manufacturing method of the single crystal according to the present invention, based on a focal length and an installation angle of the camera, may calculate the space between the melt surface and the lower end of the seed crystal after performing a projection transformation of the coordinates in the captured image of the real-image edge approximation circle and the mirror-image edge approximation circle onto coordinates in real space. Accordingly, the space between the melt surface and the lower end of the seed crystal can be calculated without calibrating ahead of time in order to obtain the conversion factor.

The manufacturing method of the single crystal according to the present invention preferably sets a reference plane at the same height position as the lower end of the seed crystal, performs the projection transformation of the real-image edge approximation circle and the mirror-image edge approximation circle onto the reference plane, and calculates the space between the melt surface and the lower end of the seed crystal from the center coordinates of the real-image edge approximation circle, center coordinates of the mirror-image edge approximation circle, and center coordinates of a camera lens. Accordingly, by using the coordinates after the projection transformation, the space between the melt surface and the lower end of the seed crystal can be easily calculated.

In the present invention, the step of measuring the space between the melt surface and the lower end of the seed crystal preferably obtains the real-image edge approximation circle positioned above the mirror-image edge approximation circle, after obtaining the mirror-image edge approximation circle from the captured image. Accordingly, the positions of the real image and the mirror image of the seed crystal in the captured image can be efficiently specified.

In the present invention, it is preferable for a step of obtaining the mirror-image edge approximation circle to include a step of specifying an upper end position of the mirror image of the seed crystal from a brightness distribution in a first region that is defined in advance in the captured image, a step of defining a second region including the upper end position of the mirror image of the seed crystal, and detecting an edge pattern of a straight-trunk portion of the mirror image of the seed crystal by performing a binarization process of the second region, and a step of approximating a circle from the edge pattern of the straight-trunk portion of the mirror image; and for a step of obtaining the real-image edge approximation circle to include a step of specifying a position where a differential value of the brightness exceeds a predetermined threshold value as a lower end position of the real image of the seed crystal when the first region is scanned upward from the center coordinates of the mirror-image edge approximation circle, a step of defining a third region including the lower end position of the real image of the seed crystal and detecting the edge pattern of the straight-trunk portion of the real image of the seed crystal by performing the binarization process of the third region, and a step of approximating a circle from the edge pattern of the straight-trunk portion of the real image. Accordingly, the center coordinates of the mirror-image edge approximation circle and the center coordinates of the real-image edge approximation circle in the captured image can be efficiently obtained.

In the present invention, the step of measuring the space between the melt surface and the lower end of the seed crystal preferably continuously captures a plurality of images that includes the real image and the mirror image of the seed crystal when the seed crystal is positioned at the same height, and calculates the space between the melt surface and the lower end of the seed crystal from the average of the values obtained from each of the plurality of images. Accordingly, the measurement accuracy of the space between the melt surface and the lower end of the seed crystal can be enhanced.

In the present invention, preferably, the seed crystal further includes a tapered portion provided below the straight-trunk portion, the lower end of the seed crystal is the lower end of the tapered portion, the taper angle of the tapered portion is greater than the installation angle of the camera, and further includes a step of measuring the length of the tapered portion in advance prior to measuring the space between the melt surface and the lower end of the seed crystal, and the step of measuring the space between the melt surface and the lower end of the seed crystal includes a step of subtracting the length of the tapered portion from the space between the melt surface and the lower end of the straight-trunk portion of the seed crystal. When the taper angle of the seed crystal is greater than the installation angle of the camera, the camera cannot capture an image of the distal end of the seed crystal and the position of the distal end of the seed crystal cannot be obtained directly from the captured image. However, according to the present invention, the space between the seed crystal and the melt surface can be measured accurately without capturing the image of the distal end of the seed crystal.

The manufacturing method of the single crystal according to the present invention preferably further includes a step of adjusting, after measuring the space between the melt surface and the lower end of the seed crystal and before the seed crystal is brought into contact with the melt, the height position of at least one crucible supporting the seed crystal and the melt such that the space becomes a target value, and a step of preheating the seed crystal by holding still at the position of the target value. According to the present invention, the variation in the preheating position is reduced when preheating the seed crystal having the tapered portion at the distal end above the melt surface, and the non-dislocation melt contacting rate of the seed crystal can be improved.

In addition, the present invention is a method measuring the space between the melt surface and the lower end of the seed crystal provided above the melt, captures an image of the seed crystal and the melt surface using the camera installed diagonally above the melt surface, generates the real-image edge approximation circle by approximating a circle from the approximately arc-shaped edge pattern at the lower end portion of the real image of the seed crystal shown in the image captured by the camera and also generates the mirror-image edge approximation circle by approximating a circle from the approximately arc-shaped edge pattern at the upper end portion of the mirror image of the seed crystal reflected on the melt surface, and the space between the lower end of the seed crystal and the melt surface is calculated based on the pixel count from the center coordinates of the real-image edge approximation circle to the center coordinates of the mirror-image edge approximation circle.

According to the present invention, even when the lower end portion of the seed crystal has the tapered shape, the space between the melt surface and the lower end of the seed crystal can be accurately obtained. Therefore, when preheating the seed crystal above the melt, variation in the preheating position is reduced and the non-dislocation melt contacting rate of the seed crystal can be improved.

Furthermore, a preheating method of the seed crystal according to the present invention includes a step of measuring the space between the melt surface and the lower end of the seed crystal by the space-measuring method noted above, a step of adjusting the height position of at least one crucible supporting the seed crystal and the melt such that the space becomes the target value, and a step of preheating the seed crystal by holding still at the position of the target value.

According to the present invention, variation in the preheating position is reduced when the seed crystal having the tapered portion at the distal end is preheated above the melt surface, and the non-dislocation melt contacting rate of the seed crystal can be improved.

Also, a single crystal manufacturing device according to the present invention includes a crucible supporting the melt, a heater for heating the melt, a crystal pulling mechanism that elevation-drives the seed crystal located above the melt, a camera capturing diagonally from above the seed crystal and the melt surface, an image processor that processes the image captured by the camera, and a controller that controls the crystal pulling mechanism based on the processing results of the image processor, and the image processor generates a real-image edge approximation circle by approximating a circle from the approximately arc-shaped edge pattern at the lower end portion of the real image of the seed crystal shown in the image captured by the camera and also generates a mirror-image edge approximation circle by approximating a circle from the approximately arc-shaped edge pattern at the upper end portion of the mirror image of the seed crystal reflected on the melt surface, and the space between the melt surface and the lower end of the seed crystal is calculated based on the pixel count from the center coordinates of the real-image edge approximation circle to the center coordinates of the mirror-image edge approximation circle.

According to the present invention, even when the lower end portion of the seed crystal has a tapered shape, the space between the melt surface and the lower end of the seed crystal can be accurately obtained. Therefore, when preheating the seed crystal above the melt, variation in the preheating position is reduced and the non-dislocation melt contacting rate of the seed crystal can be improved.

Effect of the Invention

The present invention can provide a manufacturing method of a single crystal that can accurately obtain a space between a melt surface and a lower end of a seed crystal, even when the lower end portion of the seed crystal has a tapered shape.

BRIEF DESCRIPTION OF THE DRAWINGS

FIG. 1 is a side sectional view schematically illustrating a configuration of a single crystal manufacturing device according to an embodiment of the present invention.

FIG. 6(*a*) is a schematic view where the distance between the seed crystal and the melt surface is far, FIG. 6(*b*) is a schematic view where the distance between the seed crystal and the melt surface is close, and FIG. 6(*c*) is a graph illustrating a relation between a height position of the seed crystal and a pixel count between the real image and the mirror image.

MODE FOR CARRYING OUT THE INVENTION

Figure 2:
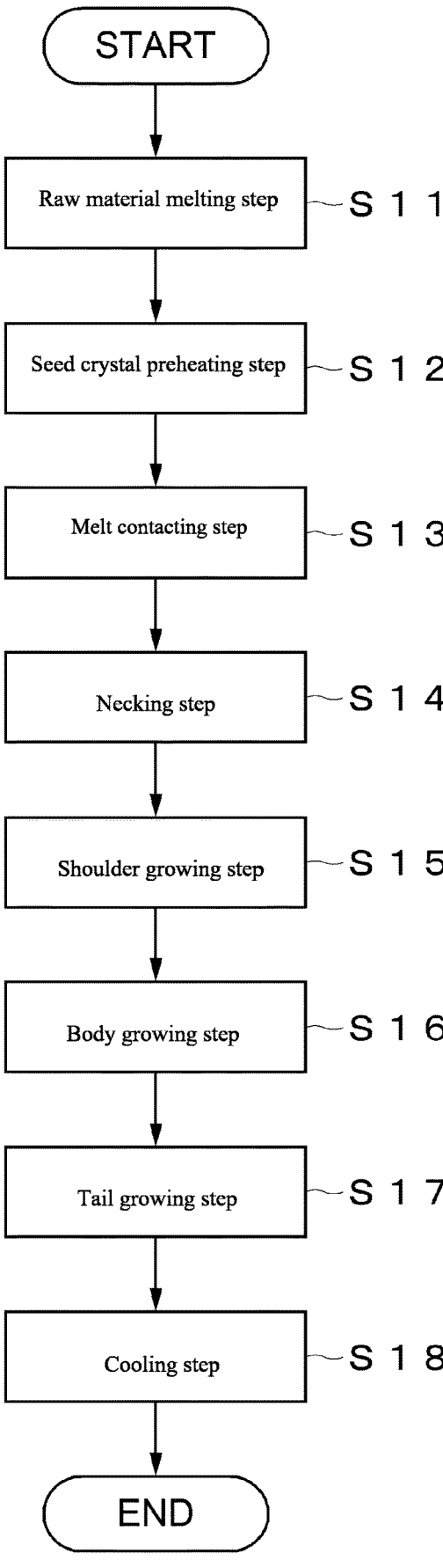
FIG. 2 is a flow chart illustrating a manufacturing process of a silicon single crystal.

Hereafter, a preferred embodiment of the present invention is described in detail with reference to the attached drawings.

Figure 1:
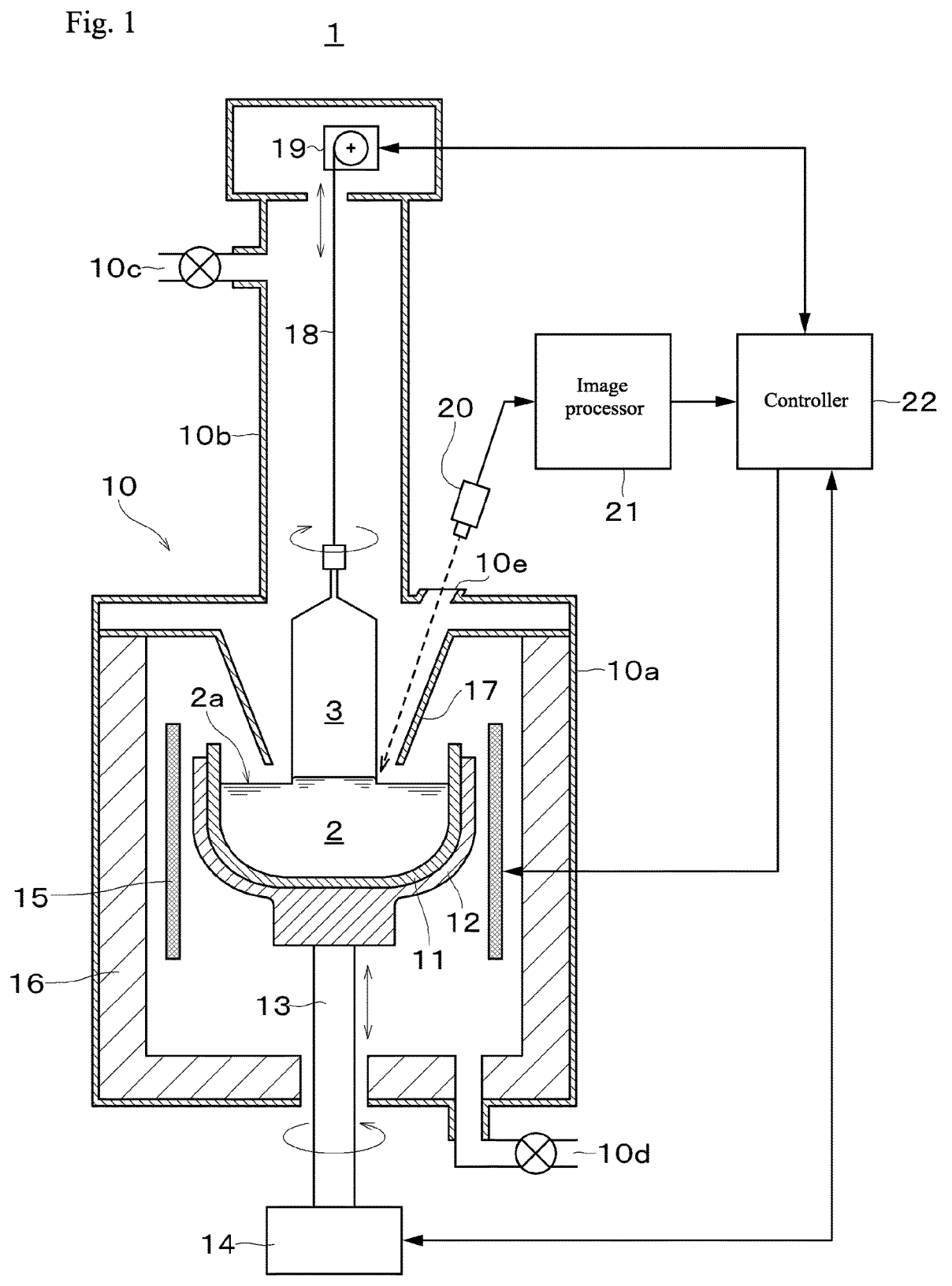

FIG. 1 is a side sectional view schematically illustrating a configuration of a single crystal manufacturing device according to an embodiment of the present invention.

As illustrated in FIG. 1, a single crystal manufacturing device 1 includes a water-cooled chamber 10, a quartzcrucible 11 that holds silicon melt 2 in the chamber 10, a graphite crucible 12 that holds the quartzcrucible 11, a rotating shaft 13 supporting the graphite crucible 12, a crucible driving mechanism 14 that rotates and elevation-drives the quartzcrucible 11 via the rotating shaft 13 and the graphite crucible 12, a heater 15 that is arranged around the circumference of the graphite crucible 12, thermal insulation material 16 that is arranged outside of the heater 15 and along an inner surface of the chamber 10, a heat shielding body 17 that is arranged above the quartzcrucible 11, a wire 18 that is a crystal pulling axis positioned coaxially with the rotating shaft 13 and is above the quartzcrucible 11, a crystal pulling mechanism 19 that is arranged above the chamber 10, a camera 20 that is located outside the chamber 10 and captures inside the chamber 10 through an observation window 10e, an image processor 21 processing the image captured by the camera 20, and a controller 22 controlling various components in the single crystal manufacturing device 1.

The chamber 10 is configured with a main chamber 10a and a slender cylindrical pull chamber 10b which is connected to an upper opening of the main chamber 10a, and the quartzcrucible 11, graphite crucible 12, heater 15, and heat shielding body 17 are provided inside the main chamber 10a. The pull chamber 10b is provided with a gas entry 10c for introducing inert gas (purge gas) such as argon gas or dopant gas into the chamber 10, and a gas outlet 10d is provided at the bottom of the main chamber 10a to discharge atmosphere gas in the chamber 10. In addition, the observation window 10e is provided at the top of the main chamber 10a and growth status of a silicon single crystal 3 can be observed through the observation window 10e.

The quartzcrucible 11 is a container that is made of quartz glass having a cylindrical side wall and a curved bottom. The graphite crucible 12 is adhered to an external surface of the quartzcrucible 11 and is held so as to wrap around the quartz crucible 11 in order to maintain the shape of the quartzcrucible 11 which is softened by heating. The quartzcrucible 11 and the graphite crucible 12 configure a double structure crucible that supports the silicon melt in the chamber 10.

The graphite crucible 12 is fixed to the upper end portion of the rotating shaft 13, and the lower end portion of the rotating shaft 13 passes through the bottom of the chamber 10 to connect to the crucible driving mechanism 14 that is provided outside the chamber 10. The graphite crucible 12, the rotating shaft 13, and the crucible driving mechanism 14 configure a rotation mechanism and an elevator mechanism of the quartzcrucible 11. The operations of rotating and elevating the quartzcrucible 11 driven by the crucible driving mechanism 14 are controlled by the controller 22.

The heater 15 is used to melt silicon raw material filled in the quartz crucible 11 to generate the silicon melt 2, as well as to maintain a molten state of the silicon melt 2. The heater 15 is a resistance heater made of carbon and is provided surrounding the quartzcrucible 11 inside the graphite crucible 12. Further, the thermal insulation material 16 is provided outside the heater 15 to surround the heater 15, thereby enhancing heat retention inside the chamber 10. Output of the heater 15 is controlled by the controller 22.

The heat shielding body 17 is provided to suppress temperature fluctuation in the silicon melt 2 to provide appropriate heat distribution near a crystal growth interface, and also prevents heating of the silicon crystal 3 by radiation heat from the heater 15 and the quartzcrucible 11. The heat shielding body 17 is a substantially cylindrical member made of graphite, and is provided to cover the area above the silicon melt 2 excluding a pulling path of the silicon single crystal 3.

A diameter of the opening on the lower end of the heat shielding body 17 is larger than the diameter of the silicon single crystal 3, thereby ensuring the pulling path of the silicon single crystal 3. In addition, an outer diameter of the lower end portion of the heat shielding body 17 is smaller than an aperture of the quartzcrucible 11 and the lower end portion of the heat shielding body 17 is located inside the quartz crucible 11, and therefore, the heat shielding body 17 does not interfere with the quartzcrucible 11 even when an upper end of a rim of the quartzcrucible 11 is raised to above the lower end of the heat shielding body 17.

Although the amount of melt in the quartzcrucible 11 is decreased as the silicon single crystal 3 grows, the quartzcrucible 11 is raised so that the space (gap) between a melt surface 2a and the heat shielding body 17 is constant, thereby controlling temperature fluctuation of the silicon melt 2 and controlling evaporation of dopant from the silicon melt 2 by keeping constant the flow speed of gas flowing in the vicinity of the melt surface 2a. Such gap control allows improvement of the stability of crystal defect distribution, oxygen concentration distribution, resistivity distribution, and the like in the pulling axis direction of the silicon single crystal 3.

The wire 18 which is the pulling axis of the silicon single crystal 3, and the crystal pulling mechanism 19 that pulls the silicon single crystal 3 by winding the wire 18 are provided above the quartzcrucible 11. The crystal pulling mechanism 19 has a function to rotate the wire 18 and the silicon single crystal 3. The crystal pulling mechanism 19 is controlled by the controller 22. The crystal pulling mechanism 19 is arranged above the pull chamber 10b, and the wire 18 is extended downward from the crystal pulling mechanism 19 through the pull chamber 10b, and the distal end of the wire 18 reaches the inner space of the main chamber 10a. FIG. 1 shows a state where the silicon single crystal 3 in the middle of growth is suspended on the wire 18. When pulling the silicon single crystal 3, the silicon single crystal 3 is grown by pulling the wire 18 gradually while rotating each of the quartzcrucible 11 and the silicon single crystal 3. The crystal pulling speed is controlled by the controller 22.

The camera 20 is arranged outside the chamber 10. The camera 20 is a CCD camera, for example, and captures an image of the inside of the chamber 10 via the observation window 10e which is formed in the chamber 10. The installation angle of the camera 20 forms a predetermined angle (preferably 20 to) 30° to a vertical direction, and the camera 20 has an optical axis tilted with respect to the pulling axis of the silicon single crystal 3. In other words, the camera 20 captures diagonally from above a top surface region of the quartzcrucible 11 including the circular opening of the heat shielding body 17 and the melt surface of the silicon melt 2.

The camera 20 is connected to the image processor 21 and the image processor 21 is connected to the controller 22. The image processor 21 calculates the crystal diameter in the vicinity of the solid-liquid interface from the edge pattern of the single crystal shown in the image captured by the camera 20. In addition, from the position of the mirror image of the heat shielding body 17 that is reflected on the melt surface in the captured image, a gap which is the distance from the lower end of the heat shielding body 17 to the melt surface 2a is calculated. The method of calculating the gap is not particularly limited, but for example, a conversion formula that is obtained by performing linear approximation of the relation between the gap and the position of the mirror image of the heat shielding body 17 is prepared in advance, and the gap can be found by substituting the position of the mirror image of the heat shielding body into the conversion formula during a crystal pulling process. Further, the gap can be geometrically calculated from the positional relationship between the real image and the mirror image of the heat shielding body 17 shown in the captured image.

The controller 22 controls the crystal diameter by controlling the crystal pulling speed based on crystal diameter data obtained from the image captured by the camera 20. Specifically, when a measured value of the crystal diameter is greater than a target diameter, the crystal pulling speed is increased, and when the measured value of the crystal diameter is smaller than the target diameter, the pulling speed is decreased. In addition, the controller 22 controls a movement amount (crucible lifting speed) of the quartzcrucible 11 based on the crystal length data of the silicon single crystal 3 that is obtained from a sensor of the crystal pulling mechanism 19 and the crystal diameter data obtained from the image captured by the camera 20.

Figure 3:
FIG. 3 is a cross-sectional view schematically illustrating a shape of the silicon single crystal ingot.

FIG. 2 is a flow chart illustrating a manufacturing process of the silicon single crystal 3. Also, FIG. 3 is a cross-sectional view schematically illustrating a shape of a silicon single crystal ingot.

As illustrated in FIG. 2, the manufacturing step of the silicon single crystal 3 according to the present embodiment includes a raw material melting step S11 that heats the silicon raw material in the quartzcrucible 11 with the heater 15 and generates the silicon melt 2, a preheating step S12 that preheats the seed crystal that is attached to the distal end of the wire 18 before bringing the seed crystal into contact with the melt, a melt contacting step S13 that lowers the seed crystal to bring the seed crystal into contact with the silicon melt 2, and crystal pulling steps (S14 to S17) that grow the single crystal by gradually pulling the seed crystal while maintaining the state of contact with the silicon melt 2.

In the crystal pulling steps (S14 to S17), a necking step S14 that forms a neck 3a where the crystal diameter is narrowed thin to achieve non-dislocation: a shoulder growing step S15 that forms a shoulder 3b where the crystal diameter gradually increases as the crystal grows: a body growing step S16 that forms a body 3c maintained at a certain crystal diameter; and a tail growing step S17 that forms a tail 3d where the crystal diameter gradually decreases as the crystal grows are performed in order.

Thereafter, a cooling step S18 is carried out that separates the silicon single crystal 3 from the melt surface and promotes cooling. The above completes a silicon single crystal ingot 31 that has the neck 3a, shoulder 3b, body 3c, and tail 3d as shown in FIG. 3.

Figure 4:
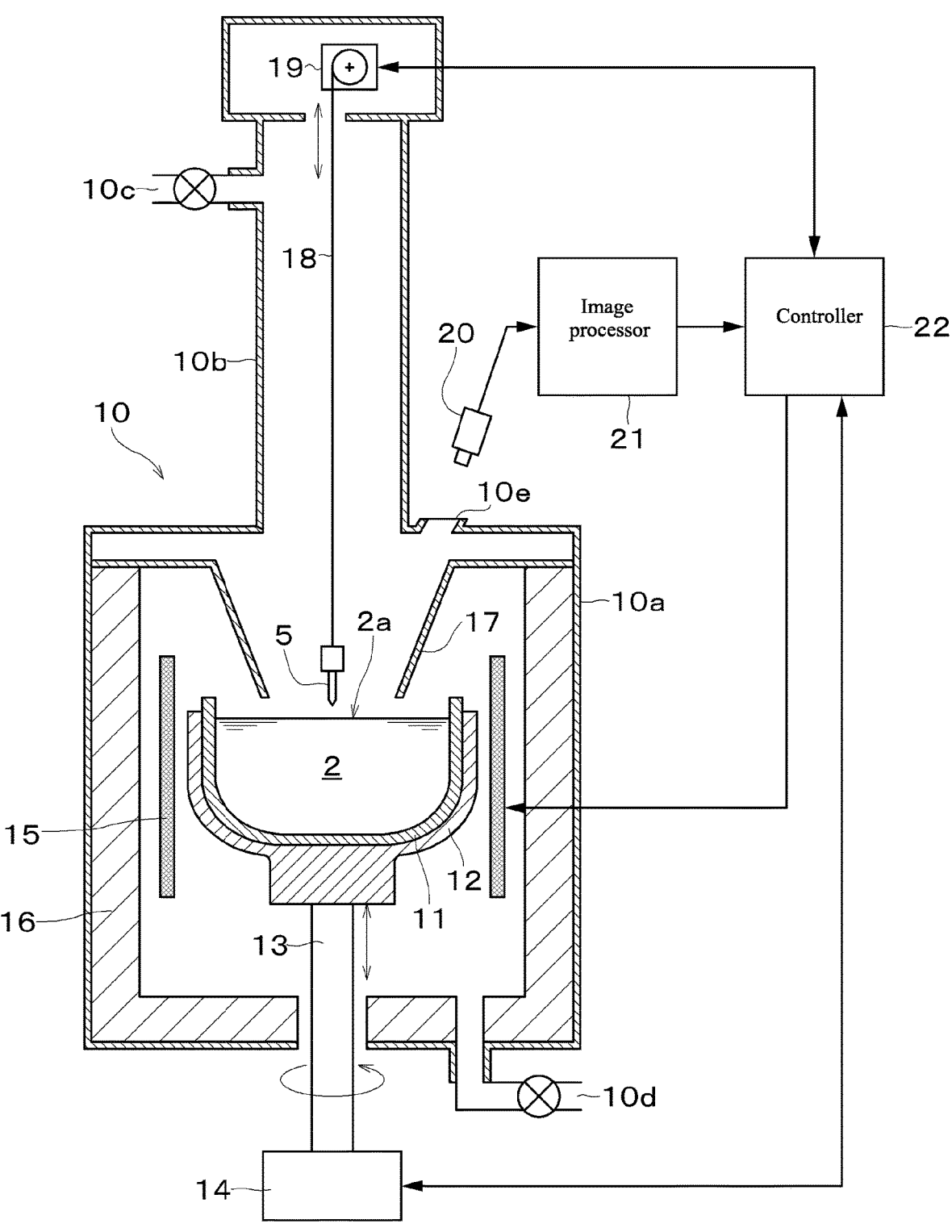
FIG. 4 is a side sectional view schematically illustrating a position of a seed crystal in a single crystal manufacturing device during a preheating process.

FIG. 4 is a side sectional view schematically illustrating a position of the seed crystal in the single crystal manufacturing device I during the preheating step S12.

As illustrated in FIG. 4, the preheating step S12 is the step of heating the seed crystal 5 by keeping the seed crystal 5 still above the melt surface 2a for a fixed amount of time. When the seed crystal 5, which has a large temperature difference from the silicon melt 2, is brought into contact with the silicon melt 2, slip dislocation occurs due to thermal shock, however, when the preheating step S12 is carried out, the dislocation is inhibited and the non-dislocation melt contacting rate of the seed crystal can be improved. When the seed crystal 5 is apart from the melt surface 2a, heat is not sufficiently added in the preheating step S12, and the temperature difference between the seed crystal 5 and the silicon melt 2 cannot be reduced. Therefore, the space between the lower end of the seed crystal 5 and the melt surface 2a must be controlled to be 5 mm or less, and the space between the lower end of the seed crystal 5 and the melt surface 2a must be accurately measured to do so.

Figure 5:
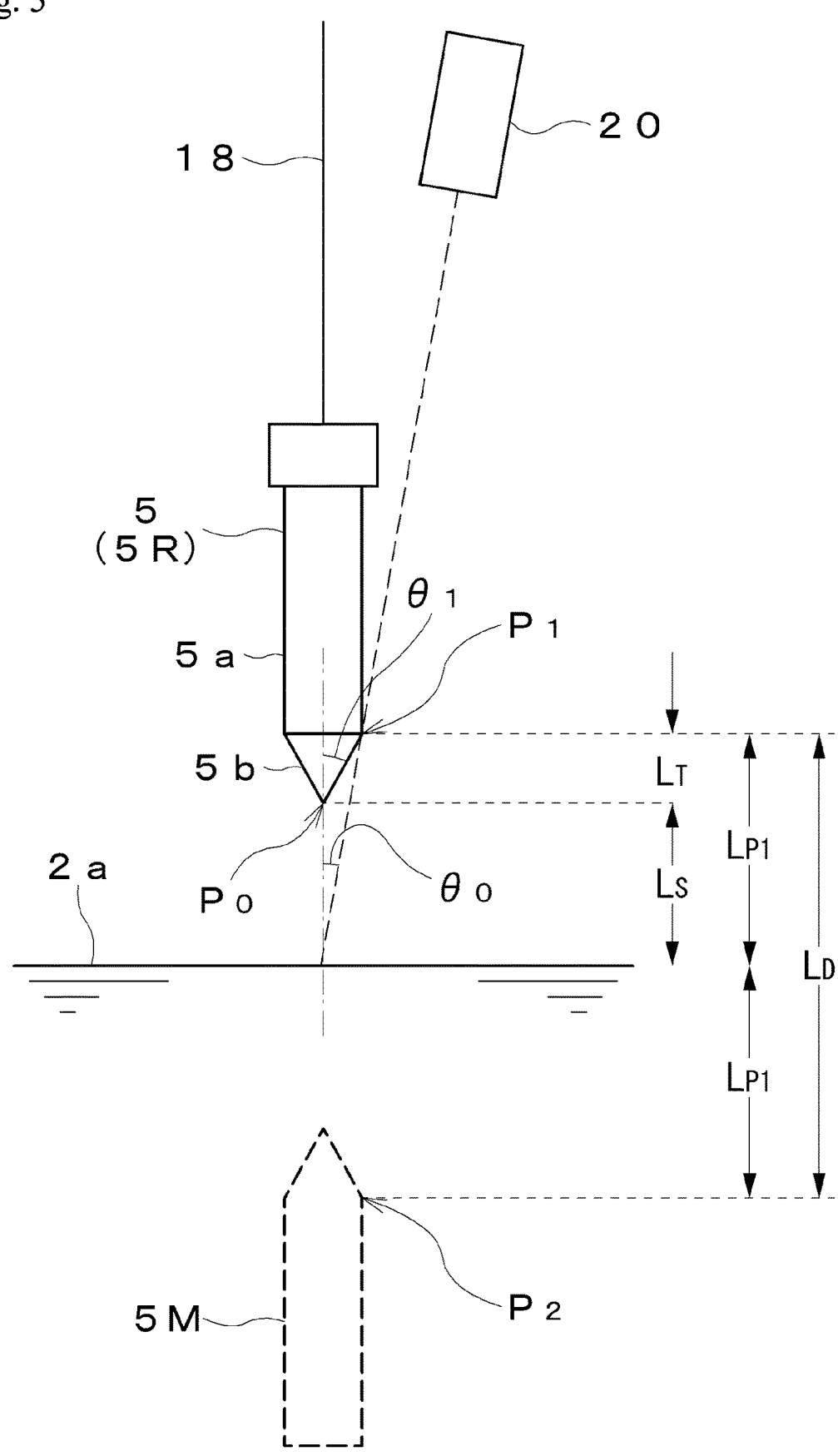
FIG. 5 is a view describing a method of measuring a space between a melt surface and a lower end of the seed crystal, and is a schematic view illustrating a positional relationship between a real image and a mirror image of the seed crystal.

FIG. 5 is a view describing a method of measuring the space between the lower end of the seed crystal 5 and the melt surface 2a, and is a schematic view illustrating the positional relationship between a real image 5R and a mirror image 5M of the seed crystal 5.

As illustrated in FIG. 5, the seed crystal 5 according to the present embodiment has a straight-trunk portion 5a with constant thickness, and a tapered portion 5b that extends downward from the lower end of the straight-trunk portion 5a. The diameter of the straight-trunk portion 5a is preferably 6 to 12 mm, and the length of the straight-trunk portion 5a is preferably 30 to 80 mm. In addition, the tapered portion 5b is preferable 5 to 100 mm long. The seed crystal 5 of this kind is manufactured by cutting a cylindrical silicon single crystal rod into a predetermined length, and thereafter performing a grinding process to sharpen the distal end and further performing an etching process to remove processing damage. The tapered shape may be a conical shape or a truncated cone shape with a flat distal end.

The taper angle $\theta_1$ of the seed crystal 5 is greater than the installation angle $\theta_0$ of the camera 20. When the distal end of the seed crystal 5 has a tapered shape of this kind, since a distal end $P_0$ of the seed crystal 5 (the lower end of the tapered portion 5b) is in a blind spot of the camera 20, the distal end $P_0$ of the seed crystal 5 cannot be captured by the camera 20. Given this, a length $L_T$ of the tapered portion 5b is accurately measured in advance, and a space $L_{P1}$ between the melt surface 2a and a lower end $P_1$ of the straight-trunk portion 5a of the seed crystal 5 which can be captured by the camera 20 is calculated, and thereafter, by subtracting the length $L_T$ of the tapered portion 5b from the space $L_{P1}$, a space $L_S=L_{P1}-L_T$ between the distal end $P_0$ of the seed crystal 5 and the melt surface 2a is obtained.

In this example, the space $L_{P1}$ between the melt surface 2a and the lower end $P_1$ of the straight-trunk portion Sa of the seed crystal 5 is half of a distance (distance between the real image and the mirror image) LD from the lower end $P_1$ of the straight-trunk portion Sa of the real image 5R of the seed crystal 5 to the mirror image $P_2$ of the lower end $P_1$. Accordingly, by obtaining the distance $L_D$ between the real image and the mirror image, the space $L_S$ between the distal end $P_0$ of the seed crystal 5 and the melt surface 2a can be obtained.

The length $L_T$ of the tapered portion 5b is preferred to be measured accurately by a non-contact measuring method, for example. When measuring the length of the tapered portion 5b in advance, it is preferable to measure the length of the tapered portion 5b at multiple positions in a circumferential direction and use the average value of the multiple measured values. This is because the length of the tapered portion 5b may vary, depending on the machining accuracy of the tapered portion 5b, based on the position on the tapered portion 5b in the circumferential direction.

As described in detail below, the distance LD between the real image and the mirror image in real space can be obtained by multiplying a predetermined conversion factor α by a pixel count (pixel count $N_D$ between the real image and the mirror image) in the captured image which is equivalent to the distance LD between the real image and mirror image. The pixel count $N_D$ between the real image and the mirror image can be obtained as the pixel count from the center coordinates (real image center coordinates $P_R(X_R, Y_R)$) of a circular outer edge of the lower end of the straight-trunk portion 5a of the real image 5R of the seed crystal 5 to the center coordinates (mirror image center coordinates $P_M(X_M, Y_M)$) of a circular outer edge of the upper end of the straight-trunk portion 5a of the mirror image 5M of the seed crystal 5.

The conversion factor α can be obtained with a calibration operation that finds a relational expression between a relative displacement amount (millimeter) in real space and a relative displacement amount (pixel count) on the captured image when the seed crystal 5 is moved the fixed distance in the vertical direction. In calibration, first, while moving the seed crystal 5 in the vertical direction, an image including the seed crystal 5 and the melt surface 2a is captured by the camera 20 at a plurality of height positions of the seed crystal 5. The plurality of height positions of the seed crystal 5 should be relative height positions rather than absolute height positions, so the plurality of height positions of the seed crystal 5 with respect to the melt surface 2a may be defined by fixating the height position of the seed crystal 5 and changing the height position of the melt surface 2a (height position of crucible).

Figure 6A:
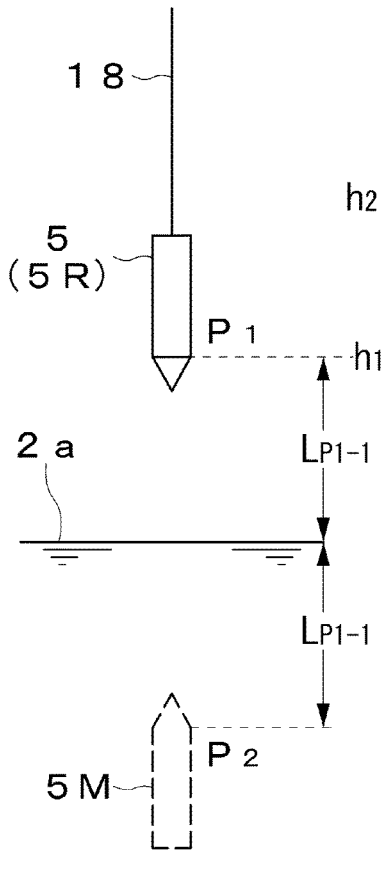
FIGS. 6(*a*) to 6(*c*) are views describing a positional relationship between the seed crystal and the melt surface.
Figure 6B:
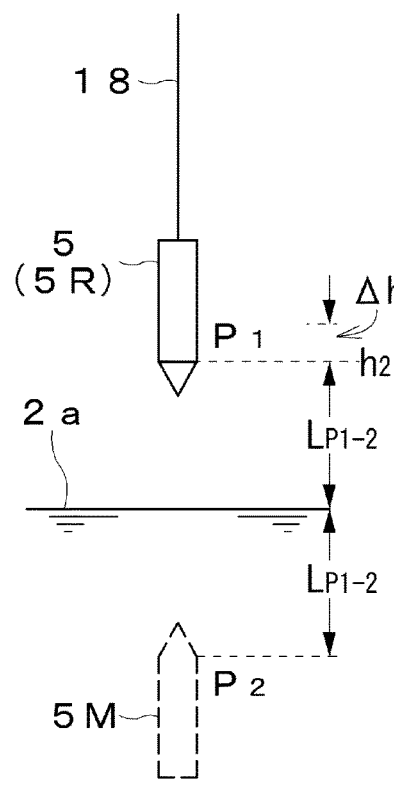
Figure 6C:
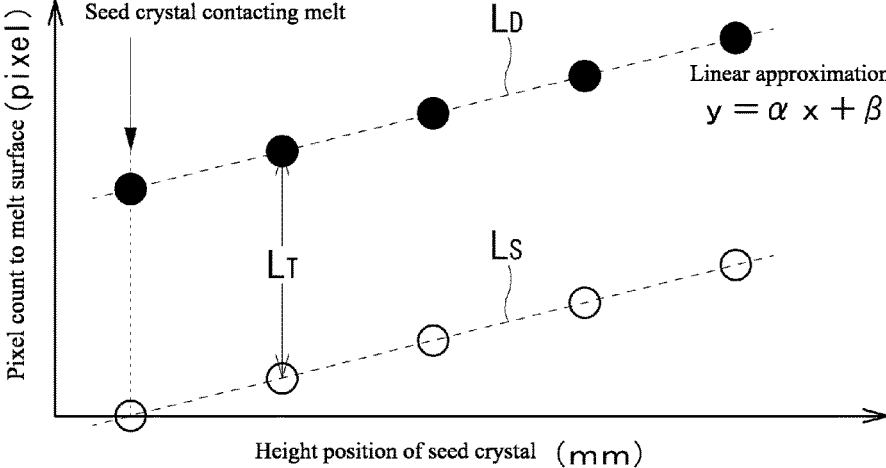

FIGS. 6(a) to 6(c) are views describing a positional relationship between the seed crystal and the melt surface: FIG. 6(a) is a schematic view where the distance between the seed crystal and the melt surface is far, FIG. 6(b) is a schematic view where the distance between the seed crystal and the melt surface is close, and FIG. 6(c) is a graph illustrating a relation between a height position of the seed crystal and the pixel count between the real image and the mirror image.

As illustrated in FIGS. 6(a) and 6(b), the real image 5R and the mirror image 5M of the seed crystal 5 has a symmetrical positional relationship across the melt surface 2a, and this relationship does not change even when the seed crystal 5 is moved in the vertical direction. For example, a descent amount (feeding amount of the wire) when the seed crystal 5 descends from a first height position $h_1$ to a second height position $h_2$ is defined as $\Delta_h = h_1 - h_2$ (mm), and at this time, when the pixel count between the real image and the mirror image changes from $N_{D1}$ to $N_{D2}$ ($N_{D1} > N_{D2}$), the ratio of an amount of change in the pixel count relative to the feeding amount Δh of the wire is obtained as $\Delta N_D / \Delta h = (N_{D1} - N_{D2})/(h_1 - h_2)$, and by using ΔND/Δh as the conversion factor α, the amount of change in the height position of the seed crystal 5 in the captured image can be converted to the amount of change in the height position of the seed crystal 5 in real space. As illustrated in FIG. 6(c), the conversion factor α can be obtained as an inclination of a first regression line ($y = \alpha x + \beta$) that shows a relation between the multiple height positions h of the seed crystal 5 and the pixel count $N_D$ between the real image and the mirror image corresponding thereto.

The distance LD between the real image and the mirror image is preferred to use the average value of the multiple values obtained from the plurality of images of the seed crystal 5 captured continuously at the same height position. The continuous capturing cycle at this time is several hundred ms. Accordingly, the measurement accuracy can be enhanced by reducing measurement errors caused by fluctuations of the measurement environment.

Figures 7A, 7B, 7C:
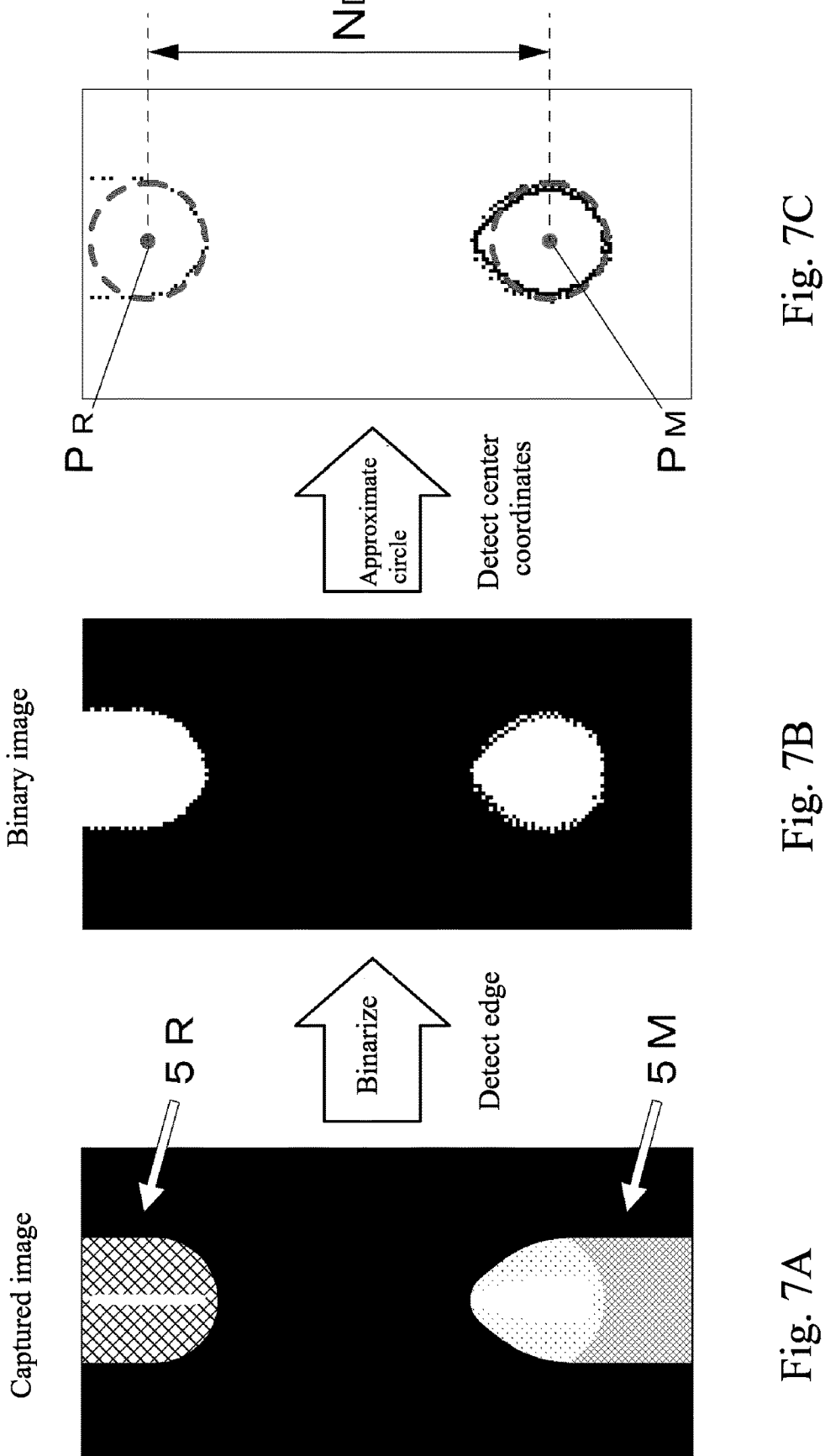
FIGS. 7(*a*) to 7(*c*) are views describing how to obtain a pixel count ND between the real image and the mirror image.

FIGS. 7(a) to 7(c) are views describing how to obtain the pixel count ND between the real image and the mirror image.

As illustrated in FIGS. 7(a) to 7(c), the distance LD between the real image and the mirror image can be obtained from the pixel count $N_D$ between the real image and the mirror image, and the pixel count ND between the real image and the mirror image can be obtained as the pixel count from the real image center coordinates $P_R$ of the seed crystal 5 in the captured image to the mirror image center coordinates $P_M$. By performing a binarization process on the captured image and detecting an approximately arc-shaped edge pattern of the straight-trunk portion 5a of the real image 5R and mirror image 5M of the seed crystal 5 respectively, the real image center coordinates $P_R$ and mirror image center coordinates $P_M$ of the seed crystal 5 can be obtained as the center coordinates of an approximation circle when approximating a circle from the edge pattern.

As another method to obtain the distance $L_D$ between the real image and the mirror image from a lower end surface of the straight-trunk portion 5a of the real image 5R of the seed crystal 5 to an upper end surface of the straight-trunk portion 5a of the mirror image 5M of the seed crystal 5, the distance $L_D$ between the real image and the mirror image is defined as the space from the lowest end of the edge pattern of the straight-trunk portion 5a of the real image 5R of the seed crystal 5 to the lowest end of the edge pattern of the straight-trunk portion 5a of the mirror image 5M of the seed crystal 5 in the captured image. However, with this method, the measurement error will likely increase due to a change in brightness distribution or effects of eccentric rotation caused by mounting position and deviation of inclination of the seed crystal 5. On the other hand, as in the present embodiment, when the respective center coordinates of the approximation circle of the edge pattern of the straight-trunk portion 5a of the real image 5R and mirror image 5M obtained from the captured image are calculated and the distance between the two center coordinates is defined as the distance $L_D$ between the real image and the mirror image, the eccentric rotation of the seed crystal and the change in the brightness distribution are unlikely to have an effect and the measurement error of the distance $L_D$ between the real image and the mirror image can be reduced.

Figure 8:
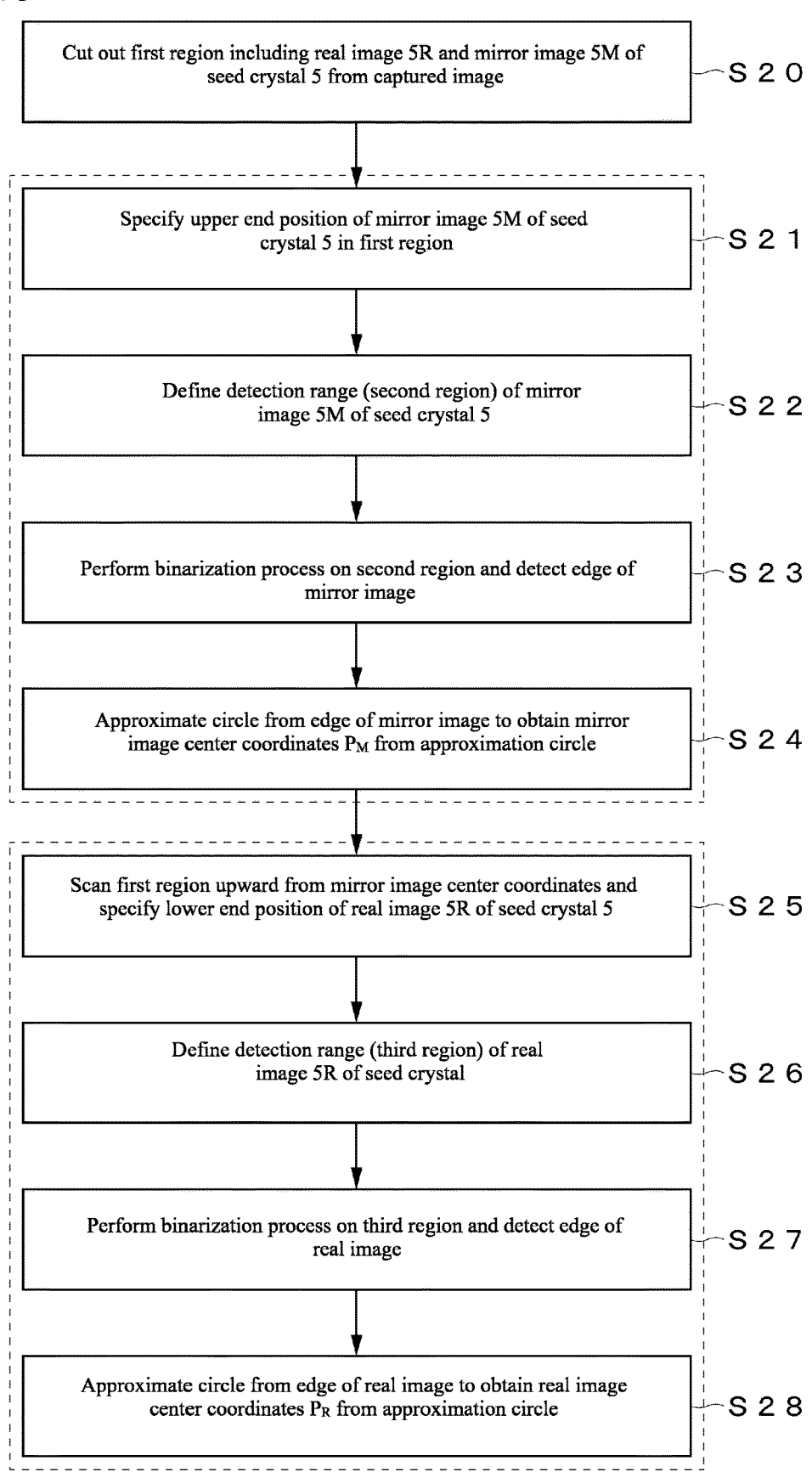
FIG. 8 is a flow chart describing in detail a detection method of real image center coordinates $P_R$ and mirror image center coordinates $P_M$ of a seed crystal 5 in a captured image.

FIG. 8 is a flow chart describing in detail a detection method of the real image center coordinates $P_R$ and the mirror image center coordinates $P_M$ of the seed crystal 5 in the captured image.

As illustrated in FIG. 8, in the present embodiment, after cutting out a first region that includes the real image 5R and the mirror image 5M of the seed crystal 5 from the image captured by the camera 20 (step S20), from the first region, the mirror image center coordinates $P_M(X_M, Y_M)$ are obtained first (steps S21 to S24), and then the real image center coordinates $P_R(X_R, Y_R)$ are obtained (steps S25 to S28). The reason for cutting out the first region from the image captured by the camera 20 is to limit a target range of the image process because the image captured by the camera 20 is a wide range image of a furnace interior, and the area thereof where the seed crystal 5 is captured is only a small portion of the captured image. In addition, the reason for obtaining the mirror image center coordinates $P_M$ first is because the brightness of the mirror image 5M of the seed crystal 5 in the captured image is higher than the brightness of the real image 5R and the position thereof is easier to identify.

In detecting the mirror image center coordinates $P_M$ of the seed crystal 5 (steps S21 to S24), a brightness level of the brightness peak value in the first region, for example 99.9%, is defined as a threshold value for the mirror image detection, and this threshold value is used to identify the upper end position of the mirror image 5M at the position of the topmost end white pixel that is obtained when the binarization process is performed on the first region (step S21).

Next, using the upper end position of the pixels identified as the mirror image 5M as a standard, an image within a set range (e.g., 50 pixels long×100 pixels wide) below that is defined as a detailed detection range (second region) of the mirror image 5M (step S22), and a brightness level that is, for example, 99% of the brightness peak value in the second region is defined as a threshold value for the edge detection. Then, this threshold value is used to binarize the image in the second region, and obtain a black-white boundary position of the binary image as the edge of the straight-trunk portion 5a of the mirror image 5M of the seed crystal 5 (step S23). Thereafter, a circle is approximated from the approximately arc-shaped edge pattern by the least squares method, and the mirror image center coordinates $P_M$ that are the center coordinates of the mirror-image edge approximation circle are obtained (step S24).

Next, in detecting the real image center coordinates $P_R$ of the seed crystal 5, the detailed detection range of the real image 5R (third region) is obtained from the first region, which is the general detection range of the real image 5R and the mirror image 5M of the seed crystal 5. Since the real image 5R of the seed crystal 5 is known to exist above the mirror image 5M, using the mirror image center coordinates $P_M$ of the seed crystal 5 as the standard, the first region is scanned upward from those coordinates and a position where the differential value of the brightness level exceeds the predetermined threshold value is determined as the lower end position of the real image 5R (step S25). Using the lower end position of the real image 5R detected in this way as the standard, an image within a set range above that position (e.g., 50 pixels long×100 pixels wide) is defined as the third region (step S26), and a brightness level that is, for example, 99% of the brightness peak value in the third region is defined as a threshold value for the edge detection. Then, this threshold value is used to binarize the image in the third region, and obtain the black-white boundary position of the binary image as the edge of the straight-trunk portion 5a of the real image 5R of the seed crystal 5 (step S27). Thereafter, a circle is approximated from the approximately arc-shaped edge pattern by the least squares method, and the real image center coordinates $P_R$ that are the center coordinates of the real-image edge approximation circle are obtained (step S28).

When the lower end of the real image 5R of the seed crystal 5 overlaps the upper end of the mirror image 5M because the lower end of the seed crystal 5 is close to the melt surface 2a, the mirror image 5M of the seed crystal 5 becomes noise for the real image 5R and it is difficult to separate the real image 5R from the mirror image 5M. In such a case, by performing an open process (expansion and contraction process) on the binary image, the mirror image 5M can be separated from the real image 5R, and the edge of the real image 5R can be specified.

After obtaining the real image center coordinates $P_R$ and the mirror image center coordinates $P_M$ of the seed crystal 5 respectively in this way, the distance $L_D$ between the real image and the mirror image of the seed crystal 5 can be obtained from the pixel count $N_D$ between the two.

In the preheating step S12 of the seed crystal 5, after measuring the space $L_S$ between the seed crystal 5 and the melt surface 2a using the method noted above, the seed crystal 5 is moved in a direction where the difference between the measured value and the target value becomes smaller. In other words, the controller 22 adjusts the height of the seed crystal 5 by operating the crystal pulling mechanism 19 or adjusts the height of the quartz crucible 11 by operating the crucible driving mechanism 14, in order to cancel out the difference between the measured value and the target value. Accordingly, the actual space $L_S$ between the melt surface 2a and the seed crystal 5 can be defined as the target space.

The space (target value) between the lower end of the seed crystal 5 and the melt surface 2a in the preheating step S12 of the seed crystal 5 is preferably 5 mm or less, and more preferably 3 mm or less. Accordingly, the temperature difference between the seed crystal and the melt can be sufficiently reduced to improve the non-dislocation melt contacting rate of the seed crystal. On the other hand, an initial space between the melt surface 2a and the seed crystal 5 prior to measuring the space between the melt surface 2a and the lower end of the seed crystal 5 is preferably 5 mm or greater. This is because there is a risk that the seed crystal 5 may be in contact with the melt when the seed crystal 5 is brought too close to the melt surface 2a in a state where the space between the melt surface 2a and the seed crystal 5 is not known accurately.

In the preheating step S12 of the seed crystal 5, the seed crystal 5 and the melt surface 2a are maintained in an adjacent state for several minutes to several hours, for example. Accordingly, the seed crystal 5 is heated by radiation heat from the silicon melt 2. By preheating the seed crystal 5 at a predetermined position above the melt surface 2a every time, the reproducibility of the temperature of the seed crystal 5 after preheating can be increased. In addition, by setting the target space sufficiently small, the temperature difference between the two can be sufficiently small, and the thermal shock when the seed crystal 5 is in contact with the melt can be reduced. Therefore, the introduction of dislocation into the seed crystal 5 can be inhibited.

Further, in the conventional method, where an operator visually adjusts the space between the melt surface 2a and the lower end of the seed crystal when preheating the seed crystal 5, the seed crystal 5 may unintentionally be in contact with the silicon melt 2 when the target space is set to a very small value, 3 mm for example. However, by accurately measuring the space between the melt surface 2a and the lower end of the seed crystal 5 according to the present embodiment, the contact between the seed crystal 5 and the melt surface 2a can be avoided.

After preheating the seed crystal 5 in this way, the seed crystal 5 is lowered to be brought into contact with the silicon melt 2, and then the seed crystal 5 is raised to grow the silicon single crystal 3.

As described above, the manufacturing method of the single crystal according to the present embodiment approximates a circle from the edge pattern of the real image and mirror image of the seed crystal 5 and obtains the distance LD between the real image and the mirror image of the seed crystal 5 based on the space from the center coordinates $P_R$ of the real-image edge approximation circle to the center coordinates $P_M$ of the mirror-image edge approximation circle. Therefore, the space between the melt surface 2a and the lower end of the seed crystal 5 can be accurately obtained even when the seed crystal 5 has the tapered portion 5b.

Next, a description is given of another method to measure the space between the melt surface 2a and the lower end of the seed crystal 5. The method of measuring the space between the seed crystal and melt surface noted above needs to use calibration to convert the space between the real image and the mirror image of the seed crystal in the image into the space between the real image and mirror image of the seed crystal in real space, and calibration to obtain the conversion factor α is necessary to do so.

Given this, the present embodiment calculates the space between the seed crystal and the melt surface directly without calibration by performing projection transformation of coordinate points in an extracted image onto coordinates in real space. More specifically, the image of the melt surface 2a inside the furnace is captured, the coordinates of the mirror image of the seed crystal 5 reflected on the melt surface 2a and the real image of the seed crystal 5 in the captured image are detected, the projection transformation of the respective coordinates of the real image and the mirror image of the seed crystal 5 onto coordinates in real space is performed, and a space ΔG between the seed crystal and the melt surface is calculated from the coordinates in real space of the real image and the mirror image of the seed crystal respectively. Hereafter, the method of projection transformation of two-dimensional coordinates of the captured image onto coordinates in real space is described in detail.

Figure 9:
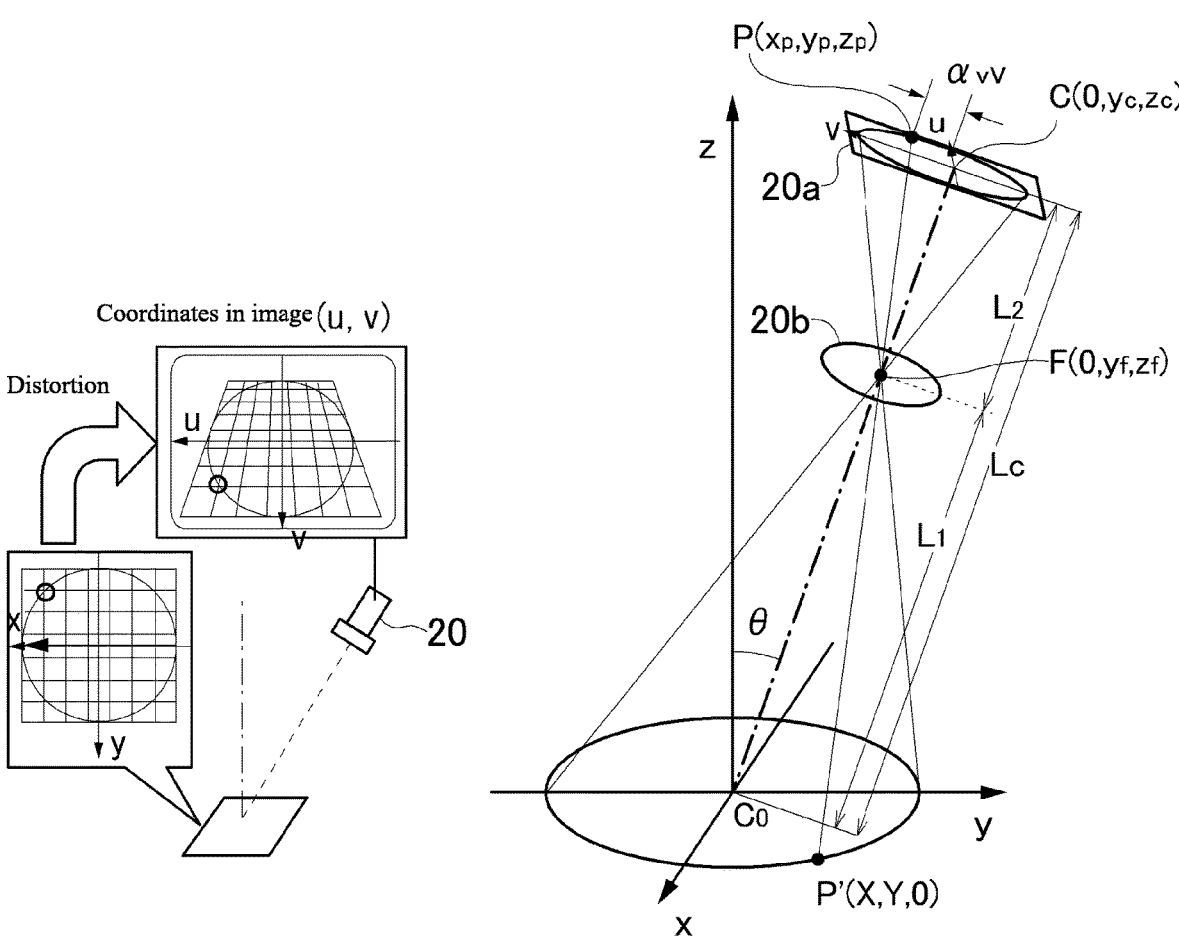
FIG. 9 is a schematic view describing a method of projection transformation of two-dimensional coordinates of the captured image onto coordinates in real space.

FIG. 9 is a schematic view describing the method of projection transformation of two-dimensional coordinates of the captured image onto coordinates in real space.

As illustrated in the left side of FIG. 9, the camera 20 captures the interior of the chamber diagonally from above, and therefore, the outer peripheral shape of the circle at the lower end of the straight-trunk portion of the seed crystal 5 in the captured image is distorted. In order to accurately calculate dimensions of each of the real image and the mirror image of the seed crystal 5, correcting the distortion of image is necessary. In view of this, distortion is corrected by performing projection transformation of the coordinates of the image captured by the camera 20 onto coordinates on a reference plane at the same height position as the lower end of the straight-trunk portion of the seed crystal 5.

The figure on the right in FIG. 9 shows a coordinate system when correcting the image. In this coordinate system, the reference plane is designated as an xy plane. In addition, the origin point $C_0$ of the XY coordinates is an intersection point of the reference plane and a straight line (dot-dashed line) that is drawn from a center position C of an imaging device 20a of the camera 20 to pass through a center position F $(0, y_f, z_f)$ of a lens 20b of the camera 20. This straight line is the optical axis of the camera 20.

Further, the pulling direction of the silicon single crystal 3 is in a positive direction of a z axis, and the center position C $(0, y_c, z_c)$ of the imaging device 20a and the center position F $(0, y_f, z_f)$ of the lens 20b are in a yz plane. The coordinates (u, v) in the image illustrated on the left side in FIG. 9 are represented by pixels of the imaging device 20a, and correspond to an arbitrary point $P(x_p, y_p, z_p)$ on the imaging device 20a as illustrated in the equation (1) below.

[Equation 1]

$$\left.\begin{array}{l} x_p = -\alpha_u u \\ y_p = y_c - \alpha_v v \cos \theta_c \\ z_p = z_c + \alpha_v v \sin \theta_c \end{array}\right\} \tag{1}$$

In this example, du and a, are a pixel size in the vertical and transverse directions of the imaging device 20a and $y_c$ and $z_c$ are the y coordinate and z coordinate of the center position C of the imaging device 20a. Also, as illustrated in the right side of FIG. 9, 0, is an angle formed by the z axis and the optical axis of the camera 20 and is the installation angle of the camera 20.

When the distance from a coordinate origin point $C_0$ on the reference plane to the center position C $(0, y, z_c)$ of the imaging device 20a is defined as $L_c$, $y_c$ and $z_c$ are respectively expressed as the equation (2) below.

[Equation 2]

$$\left.\begin{array}{l} y_c = L_c \sin \theta_c \\ z_c = L_c \cos \theta_c \end{array}\right\} \tag{2}$$

When the distance from the coordinate origin point $C_0$ to the center position F of the lens 20b of the camera 20 is defined as a, and the distance from the center position F of the lens 20b to the center position C of the imaging device 20a is defined as b, the distance $L_c$ from the coordinate origin point $C_0$ to the center position C of the imaging device 20a is expressed as the equation (3) below.

[Equation 3]

$$L_c = L_1 + L_2 \tag{3}$$

Also, based on the lens imaging formula, a focal length f, is expressed as the equation (4) below, using the distances a and b.

[Equation 4]

$$\frac{1}{f_1} = \frac{1}{L_1} + \frac{1}{L_2} \tag{4}$$

The equation (5) below shows when a distance $L_2$ is eliminated from the equations (3) and (4), and when $L_c$ is expressed with a distance $L_1$ and the focal length $f_1$.

[Equation 5]

$$L_c = L_1 + \frac{L_1 f_1}{L_1 - f_1} \tag{5}$$

The value of the distance $L_1$ from the coordinate origin point $C_0$ to the center position F of the lens 20b of the camera 20 can be expressed as the equation (6) below, using the center position F $(0, y_f, z_f)$ of the lens 20b of the camera 20.

[Equation 6]

$$L_1 = \sqrt{y_f^2 + z_f^2} \tag{6}$$

Therefore, the equation (2) noted above can be expressed as the equation (7) below, using the focal length $f_1$ of the lens 20b and the center position $F(0, y_f, z_f)$ of the lens 20b of the camera 20.

[Equation 7]

$$\left. \begin{aligned} y_c &= \sqrt{y_f^2 + z_f^2} \left[ 1 + f_i / \left( \sqrt{y_f^2 + z_f^2} - f_i \right) \right] \sin \theta_c \\ z_c &= \sqrt{y_f^2 + z_f^2} \left[ 1 + f_i / \left( \sqrt{y_f^2 + z_f^2} - f_i \right) \right] \cos \theta_c \end{aligned} \right\} \tag{7}$$

When the lens 20b is considered as a pinhole, arbitrary point $P(x_p, y_p, z_p)$ on the imaging device 20a is projected on the reference plane through $F(0, y_f, z_f)$, and the projected point $P'(X, Y, 0)$ is expressed as the equation (8) below.

[Equation 8]

$$\left. \begin{aligned} X &= -x_p z_f / (z_p - z_f) \\ Y &= (y_f z_p - y_p z_f) / (z_p - z_f) \end{aligned} \right\} \tag{8}$$

Therefore, the coordinates of the real image and the mirror image of the seed crystal that undergo the projection transformation onto the reference plane can be obtained by using the equations (1), (7), and (8).

Next, a method is described for calculating the radius and the center coordinates of the circular outer edge pattern of the lower end of the straight-trunk portion of the seed crystal. The least squares method may be used as the method for calculating the radius r and the center coordinates $(x_0, y_0)$ of the seed crystal from the coordinates of the real image and mirror image that are projected onto the reference plane. The outer edge of the lower end of the straight-trunk portion of the seed crystal is shaped in a circle, and the image of the outer edge satisfies the circle equation illustrated in the equation (9) below.

[Equation 9]

$$(x - x_0)^2 + (y - y_0)^2 = r^2 \tag{9}$$

In this example, the least squares method is used for calculating r and $(x_0, y_0)$ in the equation (9). To simplify calculating by the least squares method, the transformation illustrated in the equation (10) below is performed.

[Equation 10]

$$z = a + bx + cy \tag{10}$$

$$\left. \begin{aligned} z &= x^2 + y^2 \\ a &= r^2 - x_0^2 - y_0^2 \\ b &= 2x_0 \\ c &= 2y_0 \end{aligned} \right\}$$

Variables a, b, and c in the equation (10) are found by the least squares method. This enables obtaining a condition where the sum of squares of the difference between the equation (10) and the measured point is at the minimum, which is obtained by solving the partial differential equation illustrated in the equation (11) below.

[Equation 11]

$$\frac{\partial}{\partial a, b, c} \sum_i (a + bx_i + cy_i - z_i)^2 = 0 \tag{11}$$

The solution of this equation 11 can then be calculated by the simultaneous equation illustrated in the equation (12) below.

[Equation 12]

$$\begin{pmatrix} \sum_i z_i \\ \sum_i z_i x_i \\ \sum_i z_i y_i \end{pmatrix} = \begin{pmatrix} n & \sum_i x_i & \sum_i y_i \\ \sum_i x_i & \sum_i x_i^2 & \sum_i x_i y_i \\ \sum_i y_i & \sum_i x_i y_i & \sum_i x_i^2 \end{pmatrix} \begin{pmatrix} a \\ b \\ c \end{pmatrix} \tag{12}$$

By using the least squares method in this way, it is possible to calculate the radius and the center coordinates of the circular outer edge of the lower end of the straight-trunk portion of each of the real image 5R and mirror image 5M of the seed crystal that are projected onto the reference plane.

Figure 10:
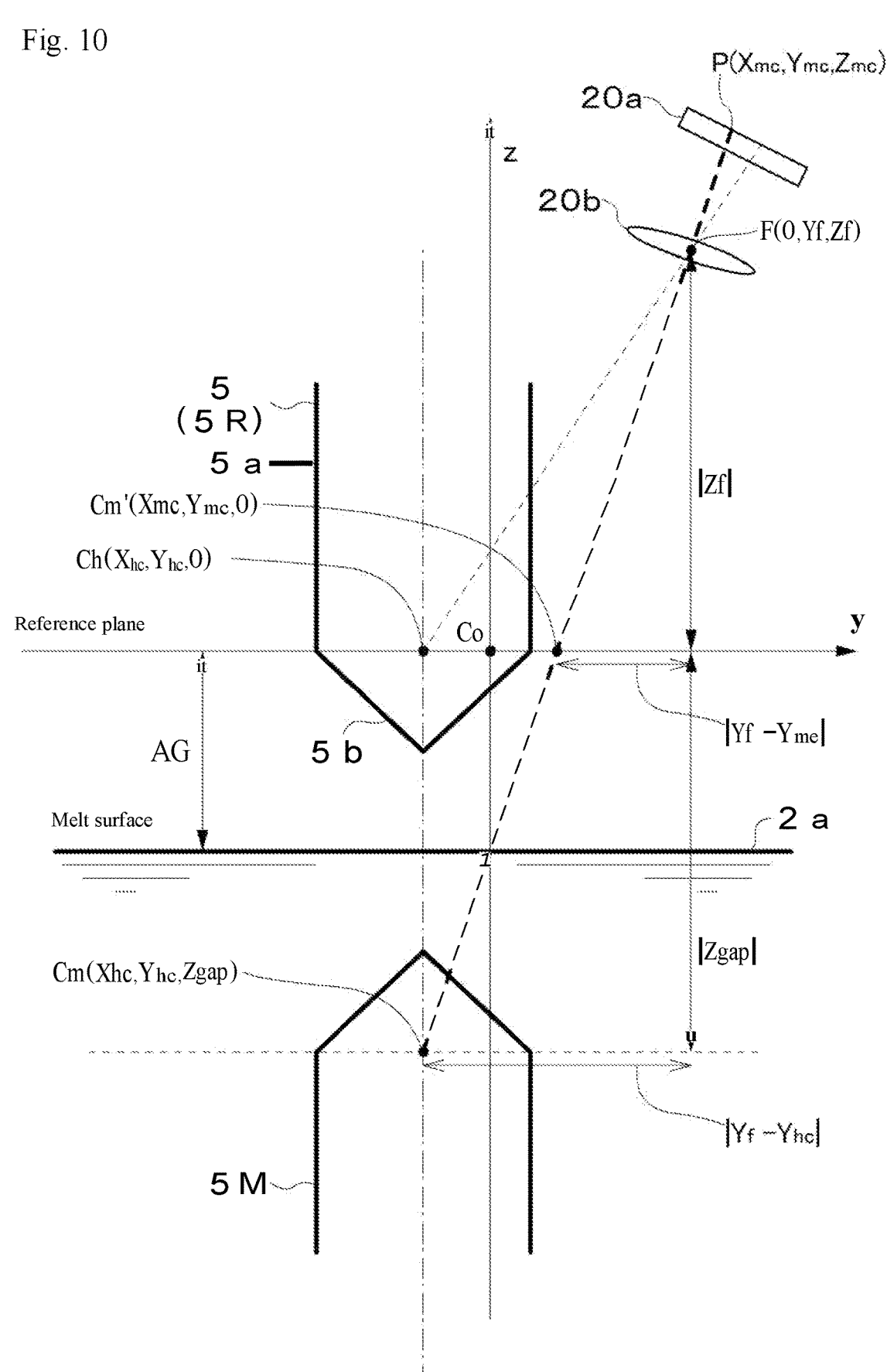
FIG. 10 is a schematic view describing a method of calculating the space between the seed crystal and the melt surface from the center coordinates of a circular outer edge pattern of the lower end of a straight-trunk portion in each of the real image and mirror image of the seed crystal.

FIG. 10 is a schematic view describing a method of calculating the space ΔG between the seed crystal and the melt surface from the center coordinates of the circular outer edge pattern of the lower end of the straight-trunk portion of each of the real image 5R and mirror image 5M of the seed crystal 5.

As shown in FIG. 10, the center coordinates Cm of the lower end of the straight-trunk portion of the mirror image 5M of the seed crystal 5 are by nature on the opposite side of the melt surface 2a from the center coordinates $C_h(X_{hc}, Y_{hc}, 0)$ of the lower end of the straight-trunk portion 5a of the real image 5R of the seed crystal 5, and the straight line connecting the two points passes through $C_h(X_{hc}, Y_{hc}, 0)$ and is parallel to the Z axis.

On the other hand, the center coordinates $C_m'(X_{me}, Y_{me}, 0)$ of the lower end of the straight-trunk portion of the mirror image 5M of the seed crystal 5 on the reference plane are the coordinates of the center coordinates $C_h(X_{he}, Y_{he}, 0)$ of the lower end of the straight-trunk portion of the real image 5R of the seed crystal 5 projected onto the reference plane, and therefore, the center coordinates $(X_{mc}, c, Y_{mc}, Z_{gap})$ of the lower end of the straight-trunk portion of the mirror image 5M of the seed crystal 5 are on the straight line that passes through the center position $F(0, y_f, z_f)$ of the lens 20b and the center coordinates $(X_{mc}, Y_{mc}, 0)$ of the lower end of the straight-trunk portion of the mirror image 5M of the seed crystal 5 on the reference plane. Therefore, the space ΔG between the melt surface and the seed crystal to be calculated is half the value Z g a p, which can be calculated from the equation (13) illustrated below.

US 12,686,942 B2

19

20

11 Quartz crucible
12 Graphite crucible
13 Rotating shaft
14 Crucible driving mechanism
15 Heater
16 Thermal insulation material
17 Heat shielding body
18 Wire
19 Crystal pulling mechanism
20 Camera
21 Image processor
22 Controller
$L_D$ Distance between real image and mirror image
$L_{P1}$ Space between melt surface and lower end of straight-trunk portion of seed crystal
$L_S$ Space between melt surface and lower end of seed crystal
$N_D$ Pixel count between real image and mirror image
$P_0$ Distal end of seed crystal
$P_1$ Lower end of straight-trunk portion of seed crystal
$P_2$ Mirror image of lower end of straight-trunk portion of seed crystal
$P_M$ Mirror image center coordinates
$P_R$ Real image center coordinates
S11 Raw material melting step
S12 Preheating step
S13 Melt contacting step
S14 Necking step
S15 Shoulder growing step
S16 Body growing step
S17 Tail growing step
S18 Cooling step
S20 First region cutting out step
S21 Mirror image position detecting step
S22 Second region cutting out step
S23 Second region binarizing step
S24 Mirror image center coordinates calculating step
S25 Real image position detecting step
S26 Third region cutting out step
S27 Third region binarizing step
S28 Real image center coordinates calculating step
$h, h_1, h_2$ Height position of seed crystal
$\Delta h$ Seed crystal feeding amount
$\alpha$ Conversion factor
$\theta, \theta_0$ Installation angle of camera
$\theta_1$ Taper angle

The invention claimed is:

1. A manufacturing method of a single crystal by the Czochralski method, comprising:
measuring a space between a melt surface and a lower end of a seed crystal provided above a melt,
lowering the seed crystal based on the space and bringing the seed crystal into contact with the melt, and
growing the single crystal at the lower end of the seed crystal by pulling the seed crystal while maintaining a state of contact with the melt, wherein
the measuring of the space between the melt surface and the lower end of the seed crystal:
captures an image of the seed crystal and the melt surface using a camera installed diagonally above the melt surface,
generates a real-image edge approximation circle by approximating a circle from an approximately arc-shaped edge pattern at a lower end portion of a real image of the seed crystal shown in the image captured by the camera and also generates a mirror-image edge approximation circle by approximating a circle from an

[Equation 13]

$$-2\Delta G = Z_{gap} = Z_f - Z_f\,(Y_{mc} - Y_f)/(Y_{hc}/Y_f) \qquad (13)$$

In this way, the space $\Delta G$ between the melt surface and seed crystal can be obtained from the center coordinates $C_h(X_{hc}, Y_{hc}, 0)$ of the real image of the seed crystal 5 on the reference plane, the center coordinates Cm' $(X_{me}, Y_{me}, 0)$ of the mirror image of the seed crystal 5 on the reference plane, and the center coordinates F $(0, y_f, z_f)$ of the lens 20b of the camera 20. In the present embodiment, the reference plane for the projection transformation is set at the same height position as the lower end of the straight-trunk portion Sa of the seed crystal 5, but can be set at other height positions. Therefore, for example, the reference plane may be set at the same height position as an opening edge of the lower end of the heat shielding body 17.

A preferable embodiment of the present invention was described above, but the present invention is not limited to the embodiment noted above, and various modifications are possible without departing from the scope of the present invention, and such modifications are, of course, covered by the scope of the present invention.

For example, in the embodiment described above, the real image edge is obtained after obtaining the mirror image edge, however, it is also possible to obtain the mirror image edge after obtaining the real image edge.

In addition, in the embodiment described above, a case where the distal end portion of the seed crystal 5 has a tapered shape is given as an example, however, the present invention can also be applied when the seed crystal 5 consists of only the straight-trunk portion 5a, and the space $L_S$ between the melt surface 2a and the lower end of the seed crystal 5 can be accurately measured based on the pixel count $N_D$ from the real image center coordinates $P_R$ to the mirror image center coordinates $P_M$ in the captured image.

Further, in the embodiment described above, a manufacturing method of a silicon single crystal is given as an example, however the present invention can also be applied to a manufacturing method of various single crystals that can be pulled by the CZ method, such as germanium and sapphire.

DESCRIPTION OF REFERENCE NUMERALS

1 Single crystal manufacturing device
2 Silicon melt
2a Melt surface
3 Silicon single crystal
3I Silicon single crystal ingot
3a Neck
3b Shoulder
3c Body
3d Tail
5 Seed crystal
5M Mirror image
5R Real image
5a Straight-trunk portion
5b Tapered portion
10 Chamber
10a Main chamber
10b Pull chamber
10c Gas entry
10d Gas outlet
10e Observation window approximately arc-shaped edge pattern at an upper end portion of a mirror image of the seed crystal reflected on the melt surface, and calculates the space between the melt surface and the lower end of the seed crystal based on the distance from the center coordinates of the real-image edge approximation circle to the center coordinates of the mirror-image edge approximation circle, the seed crystal further includes a tapered portion provided below the straight-trunk portion, the lower end of the seed crystal is the lower end of the tapered portion, and the taper angle of the tapered portion is greater than the installation angle of the camera, and the manufacturing method further comprises measuring a length of the tapered portion in advance before measuring the space between the melt surface and the lower end of the seed crystal, and the measuring of the space between the melt surface and the lower end of the seed crystal includes subtracting the length of the tapered portion from the space between the melt surface and the lower end of the straight-trunk portion of the seed crystal.

2. The manufacturing method of the single crystal according to claim 1, further comprising converting to distance units in a real space by multiplying a conversion factor by a half value of a pixel count from the center coordinates of the real-image edge approximation circle to the center coordinates of the mirror-image edge approximation circle.

3. The manufacturing method of the single crystal according to claim 2, further comprising obtaining the conversion factor, before measuring the space between the melt surface and the lower end of the seed crystal, from an amount of change in a pixel position of the seed crystal in the captured image when the position of the seed crystal is moved by a fixed distance in a vertical direction.

4. The manufacturing method of the single crystal according to claim 1, wherein the space between the melt surface and the lower end of the seed crystal is calculated, based on a focal length and an installation angle of the camera, after performing a projection transformation of the coordinates in the captured image of the real-image edge approximation circle and the mirror-image edge approximation circle onto coordinates in real space.

5. The manufacturing method of the single crystal according to claim 4, wherein a reference plane is set at the same height position as the lower end of the seed crystal, the projection transformation of the real-image edge approximation circle and the mirror-image edge approximation circle is performed onto the reference plane, and the space between the melt surface and the lower end of the seed crystal is calculated from the center coordinates of the real-image edge approximation circle, center coordinates of the mirror-image edge approximation circle, and center coordinates of a lens of the camera.

6. The manufacturing method of the single crystal according to claim 1, wherein the measuring of the space between the melt surface and the lower end of the seed crystal obtains the real-image edge approximation circle positioned above the mirror-image edge approximation circle, after obtaining the mirror-image edge approximation circle from the captured image.

7. The manufacturing method of the single crystal according to claim 6, wherein obtaining the mirror-image edge approximating circle comprises:

specifying an upper end position of the mirror image of the seed crystal from a brightness distribution in a first region that is defined in advance in the captured image, defining a second region including the upper end position of the mirror image of the seed crystal, and detecting an edge pattern of a straight-trunk portion of the mirror image of the seed crystal by performing a binarization process of the second region, and approximating a circle from the edge pattern of the straight-trunk portion of the mirror image, wherein the obtaining of the real-image edge approximation circle comprises:

specifying a position where a differential value of the brightness exceeds a predetermined threshold value as a lower end position of the real image of the seed crystal when the first region is scanned upward from the center coordinates of the mirror-image edge approximation circle, defining a third region including the lower end position of the real image of the seed crystal and detecting the edge pattern of the straight-trunk portion of the real image of the seed crystal by performing the binarization process of the third region, and of approximating a circle from the edge pattern of the straight-trunk portion of the real image.

8. The manufacturing method of the single crystal according to claim 1, wherein the measuring of the space between the melt surface and the lower end of the seed crystal:

continuously captures a plurality of images that includes the real image and the mirror image of the seed crystal when the seed crystal is positioned at the same height, and calculates the space between the melt surface and the lower end of the seed crystal from an average of the values obtained from each of the plurality of images.

9. The manufacturing method of the single crystal according to claim 1, further comprising:

adjusting, after measuring the space between the melt surface and the lower end of the seed crystal and before the seed crystal is brought into contact with the melt, the height position of at least one crucible supporting the seed crystal and the melt such that the space becomes a target value, and preheating the seed crystal by holding still at the position of the target value.

* * * * *